US 6,723,611 B2

(12) United States Patent
Akatsu et al.

(10) Patent No.: US 6,723,611 B2
(45) Date of Patent: Apr. 20, 2004

(54) VERTICAL HARD MASK

(75) Inventors: Hiroyuki Akatsu, Yorktown Heights, NY (US); Oleg Gluschenkov, Wappingers Falls, NY (US); Porshia S. Parkinson, Danbury, CT (US); Ravikumar Ramachandran, Pleasantville, NY (US); Helmut Horst Tews, Munich (DE); Kenneth T. Settlemyer, Jr., Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/241,225

(22) Filed: Sep. 10, 2002

(65) Prior Publication Data

US 2004/0048441 A1 Mar. 11, 2004

(51) Int. Cl.$^7$ ................................. H01L 21/20
(52) U.S. Cl. .................. 438/386; 438/243; 438/255
(58) Field of Search .................. 257/296, 301, 257/309; 438/243, 245, 246, 255, 294, 353, 361, 386, 388, 439, 492

(56) References Cited

U.S. PATENT DOCUMENTS

| | | | | |
|---|---|---|---|---|
| 4,843,025 A | * | 6/1989 | Morita | 437/47 |
| 5,910,018 A | * | 6/1999 | Jang | 438/425 |
| 6,018,174 A | * | 1/2000 | Schrems et al. | 257/296 |
| 6,146,938 A | * | 11/2000 | Saida et al. | 438/239 |
| 6,150,257 A | * | 11/2000 | Yin et al. | 438/622 |
| 6,313,033 B1 | * | 11/2001 | Chiang et al. | 438/654 |
| 6,455,369 B1 | * | 9/2002 | Forster et al. | 438/249 |
| 6,534,376 B2 | * | 3/2003 | Tews | 438/386 |

FOREIGN PATENT DOCUMENTS

EP 0684637 * 5/1995 ......... H01L/21/318

OTHER PUBLICATIONS

Pending U.S. patent application No. 10/013,797, filed Dec. 10, 2001, Michael P. Chudzik, et al, entitled "Vertical Thermal Nitride (Anti–Collar) and Processing Thereof".*

* cited by examiner

Primary Examiner—Evan Pert
Assistant Examiner—Asok Kumar Sarkar
(74) Attorney, Agent, or Firm—Daryl Neff (57) ABSTRACT

In the course of forming a trench capacitor or similar structure, the sidewalls of an aperture in a substrate are lined with a film stack containing a diffusion barrier; an upper portion of the outer layer is stripped, so that the upper and lower portions have different materials exposed; the lower portion of the film stack is stripped while the upper portion is protected by a hardmask layer; a diffusion step is performed in the lower portion while the upper portion is protected; and a selected material such as hemispherical grained silicon is deposited selectively on the lower portion while the exposed surface of the upper portion is a material on which the selected material forms poorly, so that the diffusing material penetrates and the selected material is formed only on the lower portion.

19 Claims, 6 Drawing Sheets

VERTICAL HARD MASK

FIELD OF THE INVENTION

The field of the present invention is a method of fabricating an opening, e.g., trench or via, in a substrate wherein a thin, uniform nitride ($Si_3N_4$) vertical hard mask, which blocks diffusion of dopants into the substrate, is formed on at least an upper portion of exposed sidewalls of the opening. A lower trench liner having selective deposition properties that deposits poorly on the hardmask is deposited in the lower portion of the trench.

BACKGROUND OF THE INVENTION

Trench or via processing for three-dimensional (3D) microelectronic fabrication, e.g., dynamic random access memory (DRAM) cells, includes making a portion of a trench or via for p-n junction definition by diffusion; non-uniform (enhanced) doping of selected areas; and formation of electrical isolation regions in selected areas. Therefore, a masking method is needed to select portions of a trench or via for the desired processing. In general, masking processes require the use of a hard mask (planar or vertical) to protect selected portions of the substrate against doping, etching, oxidation, deposition, implantation, and other processing. Contrary to a photoresist (PR) and other polymer masks, hard masks are able to withstand high-temperature processing. In addition, hard masks may have a higher etch selectivity than that of a polymer mask. The fabrication sequence for a planar hard mask is straightforward. First, a hard mask material is deposited over an entire surface of a substrate and thereafter a patterned PR mask is formed over the hard mask using conventional photolithographic methods. Next, the hard mask material is removed from selected areas utilizing a selective etching process. Consequently, the remaining planar hard mask material protects pre-selected areas of the substrate. The fabrication sequence of a vertical hard mask, on the other hand, is more complicated. Indeed, there are no known photolithography methods that would leave photoresist in the upper portion of a trench or via and remove resist from the bottom portion of the trench or via. The vertical hard masks are typically made utilizing the following five steps: (i) depositing a sacrificial material into an opening of a 3D microelectronic structure; (ii) planarizing the sacrificial material; (iii) recessing the sacrificial material to a predetermined depth; (iv) forming a hard mask on an upper portion of the opening; and (v) removing the sacrificial material from the opening. There are several requirements for using vertical hard masks which include: (1) a vertical hard mask should be suitable for use with high-temperature (about 300° C.–1100° C.) processing and the vertical hard mask should not lose its masking properties at the above-mentioned high-temperatures; (2) the, vertical hard mask should be substantially thin (as compared to the mouth of the trench or via) so that the hard mask does not interfere with the deposition of various materials into the trench or via; and (3) the process sequence needed to create such a hard mask must be relatively simple. One standard way of producing a vertical hard mask for lining at least a portion of a trench or via is to use a thin oxide ($SiO_2$) grown on an exposed surface of a Si-containing substrate, while protecting selected areas with deposited silicon nitride. Because silicon nitride oxidizes very slowly one can grow a relatively thick layer of thermal oxide on the Si-containing substrate, while oxidizing only several atomic layers of silicon nitride. Subsequently, silicon nitride is stripped selectively to the thick oxide layer grown on the Si-containing substrate. There are several problems with using such an approach. A vertical mask comprising a thermally grown oxide layer is not a good diffusion barrier; therefore, the thermal oxide mask has to be grown relatively thick in order to block dopant diffusion. For narrow openings, i.e., trenches or vias, the thickness of the oxide mask can be comparable to the dimensions of the opening preventing a good fill into the trench or via. In addition, thermally grown oxide masks are not typically uniform along the perimeter of the opening (the thermally grown oxide is usually thinner at the corners). Such non-uniformity is due to the different oxidation rate of different crystallographic planes of silicon and build-up of stress in the corners. One known modification to the oxide mask process described above is directed towards thermal nitridation of the oxide mask. When nitrogen is introduced into a thermally grown oxide mask, the nitrogen reduces diffusion of dopants through the thermal oxide layer. Due to a high chemically stability of the thermally grown oxide layer only a small percentage (typically below 20 atomic percent) of nitrogen atoms is incorporated into the thermal oxide mask. Therefore, the oxynitride or nitrided oxide mask has to be relatively thick to block dopant diffusion at high temperatures. In view of the above drawbacks with thermally grown oxide vertical masks, a new and improved method is required to form a thin, uniform vertical hard mask, which functions as a diffusion barrier so as to prevent unwanted diffusion of dopant into substrate during p-n junction definition.

SUMMARY OF THE INVENTION

The present invention relates to a method for fabricating 3D microelectronic structures in which a layer of a selected trench liner material is deposited on a lower portion while a vertical hard mask that is resistant to deposition of the material protects the upper portion.

A feature of the present invention is providing a method of fabricating 3D microelectronic structures which include at least one opening present in a semiconductor substrate wherein a thin, uniform vertical hard mask is formed on an upper portion of exposed sidewalls of the opening while a selected layer is deposited on the bottom.

Another feature of the invention is the formation of a trench capacitor, in which the capacitor is formed at the bottom of the trench while the vertical mask protects the top.

These and other objects and advantages are achieved in the present invention by forming a thin nitride vertical hard mask on at least an upper portion of exposed interior sidewalls of an opening formed in a substrate (either semiconducting or insulating).

The inventive method comprises the steps of: (a) forming a set of openings in a surface of a substrate, each opening having sidewalls that extend to a common bottom wall; (b) forming a nitride layer on at least an upper portion of each sidewall of the openings; (c) stripping the film stack in the lower part; and (d) forming a desired layer by selective deposition.

DETAILED DESCRIPTION OF THE INVENTION

The present invention, which provides a method of forming a nitride vertical hard mask on at least an upper portion of an opening formed in a substrate as well as the resultant 3D microelectronic structure formed by the aforementioned method, will now be described in greater detail by referring to drawings that accompany the present application. It is noted that the attached drawings illustrate a preferred embodiment of the present invention wherein a thin, uniform nitride vertical hard mask is employed to protect an upper portion of an opening formed in a semiconductor substrate. Although illustration is given for this preferred embodiment, the inventive method works in other applications in which a vertical hard mask is required to be formed on at least an upper portion of an opening formed in a substrate. The term "substrate" is used herein to denote both semiconducting as well as insulating materials (including organic and inorganic insulators), with semiconducting materials being exemplified in the accompanying drawings, including silicon on insulator and equivalent wafer structures for other semiconductor materials.

Figure 1:
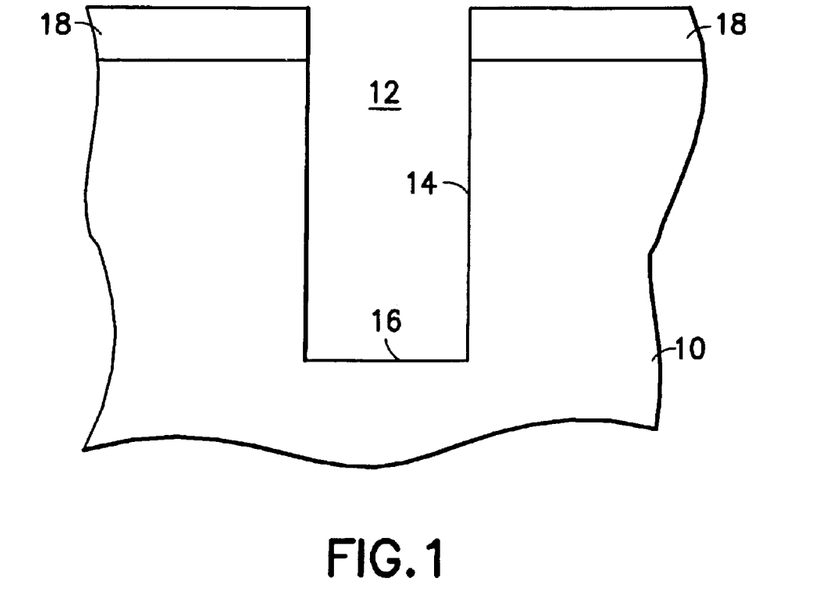
FIGS. 1–9 are pictorial representations (through cross-sectional views) illustrating the various processing steps of the present invention.

FIG. 1 illustrates an initial structure that may be employed in the inventive method. Specifically, the initial structure shown in FIG. 1 includes semiconducting substrate 10 having opening 12 that has been formed in a conventional process therein. Opening 12 includes sidewalls 14 which extend to common bottom wall 16. It is noted that although this drawing shows the presence of a single opening in the substrate, for clarity in exposition, the inventive method will typically be applied to a number of integrated circuits on a wafer and to a number of openings in each circuit. The structure shown in FIG. 1 also includes an optional planar hard mask which is labeled as 18 in FIG. 1.

The initial structure shown in FIG. 1 is composed of conventional materials well known to those skilled in the art and conventional processing techniques that are also well known to those skilled in that art are employed in fabricating the same. For example, semiconducting substrate 10 may be comprised of Si, Ge, SiGe, GaAs, InAs, InP or all other III/V semiconductor compounds. Layered semiconducting substrates such as Si/SiGe, Si/Si and silicon-on-insulators (SOIs) are also contemplated herein. The substrate materials can be in either crystalline, polycrystalline (poly), or amorphous form. The semiconductor substrate may be of the n- or p-type depending on the desired devices to be fabricated. The semiconductor substrate may contain active device regions, wiring regions, isolation regions (e.g., trench isolation or LOCOS) or other like regions. For clarity, these other regions are not shown in the drawings, but are nevertheless meant to be included within region 10. Optional planar hard mask 18 may then be formed atop the surface of substrate 10 utilizing a deposition process, such as chemical vapor deposition (CVD), plasma-assisted CVD, sputtering, and chemical solution deposition, well known to those skilled in the art. The optional planar hard mask may be composed of an oxide, nitride, glass material or any combination thereof including a stack such as nitride/oxide/BPSG (boron doped silicate glass).

Before the step shown in FIG. 1, a photoresist mask, not shown, was formed atop the surface of the optional planar hard mask (or atop substrate 10, when no planar hard mask is employed) utilizing a conventional deposition process and thereafter the photoresist mask was patterned utilizing conventional lithography which includes exposing the photoresist to a pattern of radiation, and developing the pattern into the exposed photoresist utilizing a conventional resist developer. After the photoresist was patterned, the pattern was transferred into the optional planar mask and substrate utilizing a conventional dry etching process such as reactive-ion etching, plasma-etching, ion beam etching, laser ablation or any combination thereof so as to form opening 12 in the substrate. It should be noted that the term "opening." is used herein to denote a trench, via or any other type of passageway that may be formed into a substrate. The depth of the opening, measured from the uppermost surface of substrate 10, is not critical to the present invention. Typically, however, the opening has a depth, measured from the top surface of substrate 10, of from about 0.1 to about 10 $\mu$m, with a depth of from about 5 to about 10 $\mu$m being more highly preferred.

Figure 2A:
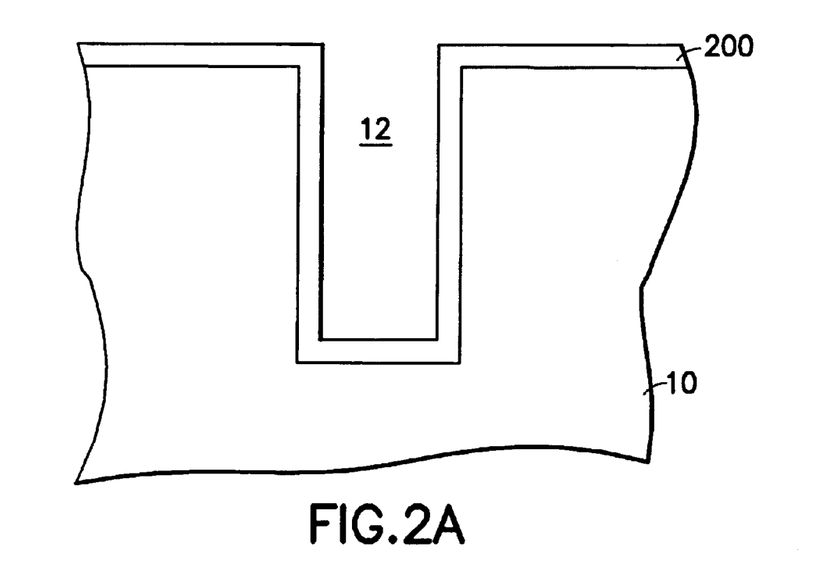
Figure 2B:
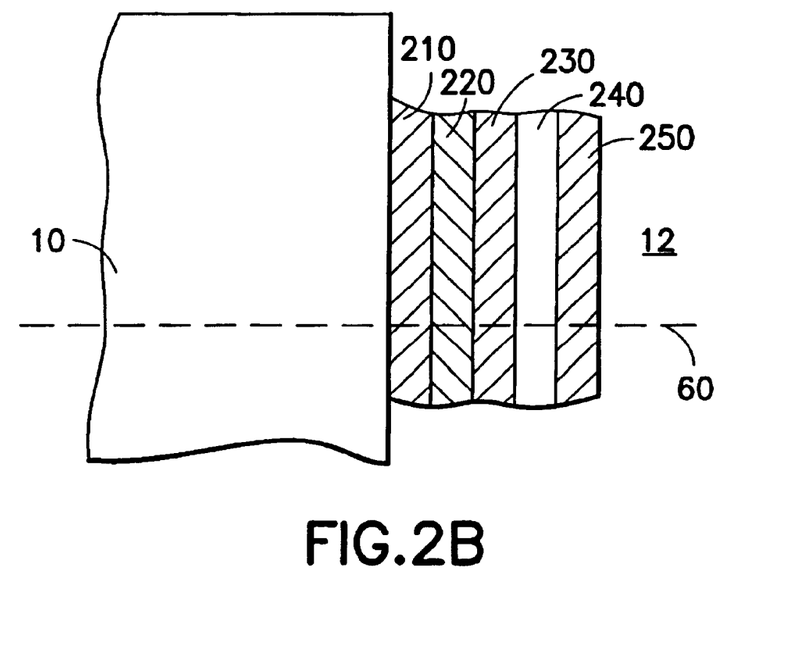

Following the formation of the opening, the photoresist is removed utilizing a conventional stripping process well known to those skilled in the art so as to provide the structure shown in FIG. 1. At this point of the inventive process the optional planar hard mask can be removed utilizing a conventional selective wet etching such as a hot phosphoric acid in the case of silicon nitride hard mask. Next, and as shown in FIG. 2A, film stack 200 is formed on all exposed surfaces of substrate 10, including the vertical sidewalls and horizontal bottom wall of the opening. As shown in FIG. 2B, a pad oxide optional layer 210 is formed utilizing a conventional deposition process such as CVD, or alternatively, oxide layer 20 is formed by a conventional thermal oxidation process. The oxide layer formed at this point of the present invention is a uniform, thin oxide layer having a thickness of from about 2 to about 5 nm, with 2.8 nm being preferred. A layer of nitride 220 of 3–15 nm in thickness (with 5–10 nm being preferred) is formed atop of the optional pad oxide 220 or substrate 10. The nitride layer is formed utilizing a conventional deposition process such as CVD, including the following vapor mixtures: silane (SiH4) and ammonia (NH3), diclorosilane (DCS) and ammonia (NH3), and triclorosiline (TCS) and ammonia (NH3), or alternatively, nitride layer 220 is formed by a combination of a conventional CVD process and a conventional thermal nitridation process including nitridation by ammonia (NH3), hydrazine (N3H), atomic nitrogen, or other nitrogen-containing reactive gas. A thin optional layer of oxide 230 is formed atop of nitride 220. The oxide layer 230 is a uniform, thin oxide layer having a thickness of from about 1 to about 5 nm, with 2–5 nm being preferred. The oxide layer 230 is formed utilizing a conventional deposition process such as CVD, including the vapor mixture of tetraethyloxysilane (TEOS) and oxygen, or alternatively, oxide layer 230 is formed by a conventional thermal oxidation process that oxidizes silicon nitride including oxidation by atomic oxygen-containing mixture such as ozone, oxygen plasma, or In-Situ Steam Generated (ISSG) mixture. A layer of amorphous silicon (a-Si) 240 is formed atop of the optional oxide layer 230 or the nitride 220. The a-Si layer 240 is a uniform, thin, amorphous Si layer having a thickness of from about 10 to about 20 nm, with 10–15 nm being preferred. The a-Si layer 240 is formed utilizing a conventional deposition process such as CVD. The amorphous phase is achieved by selecting a deposition temperature below that of the amorphous-crystalline silicon phase transition. A layer of silicon oxide 250 is formed atop of the a-Si layer 240. The oxide layer 250 is a uniform, thin oxide layer having a thickness of from about 5 to about 15 nm, with 6–10 nm being preferred. The oxide layer 250 is formed utilizing a conventional deposition process such as CVD, including the vapor mixture of tetraethyloxysilane (TEOS) and oxygen, or alternatively, oxide layer 250 is formed by a conventional thermal oxidation process including oxidation by molecular oxygen, nitrous oxide, or atomic oxygen-containing mixture such as ozone, oxygen plasma, or In-Situ Steam Generated (ISSG) low-pressure mixture. If the process for forming layer 250 is conducted at a temperature that is higher than the temperature of amorphous-crystalline silicon phase transition (520–600° C.), then the a-Si layer 240 undergoes a phase transition to the polycrystalline (poly) phase. We have found that such phase transition can cause a huge thickness variation of layer 240 making it discontinuous in some cases. Therefore, in order to ensure the integrity of stack 200 it is highly desirable to conduct at least an initial portion of the process at a temperature below that of the phase transition. Subsequently, a low-temperature fast oxidation by an atomic oxygen-containing mixture is a preferred process for forming film 250. In this case, the entire process can be conducted without inducing crystallization. Once a relatively thick (>2 nm) oxide layer 250 is formed the stack 200 can be optionally annealed at a high temperature without a large penalty in the stack uniformity or integrity, for the a-Si layer is constrained in between two oxide films 230 and 250 and cannot easily change its thickness during the phase transition. In addition, we have also found that in the absence of the optional oxide layer 230 the stack 200 is more susceptible to the loss of integrity after a high-temperature process. This is due to the difference in free energies of oxide-Si and nitride-Si interfaces. Therefore, the presence of optional oxide layer 230 contributes to the stack integrity at high temperature.

Figure 3:
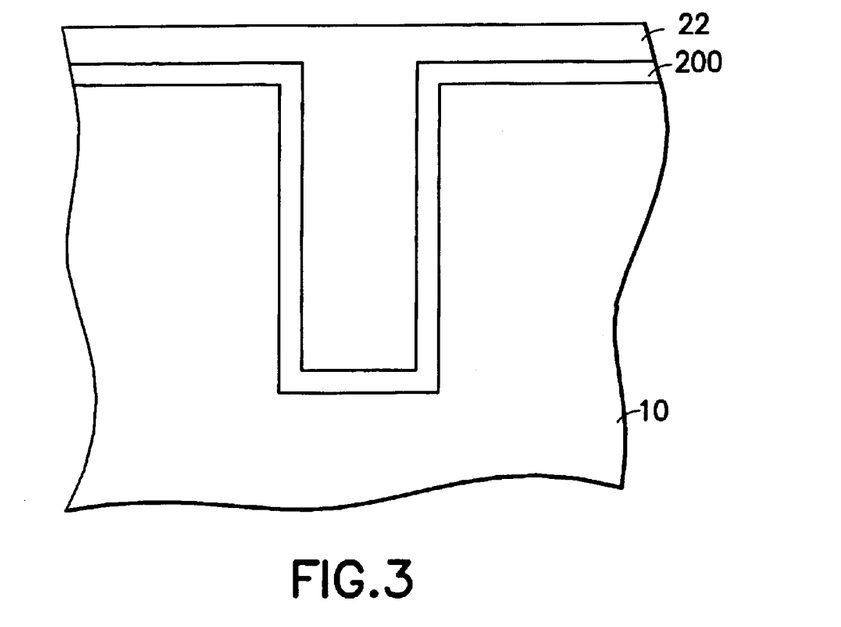
Figure 4:
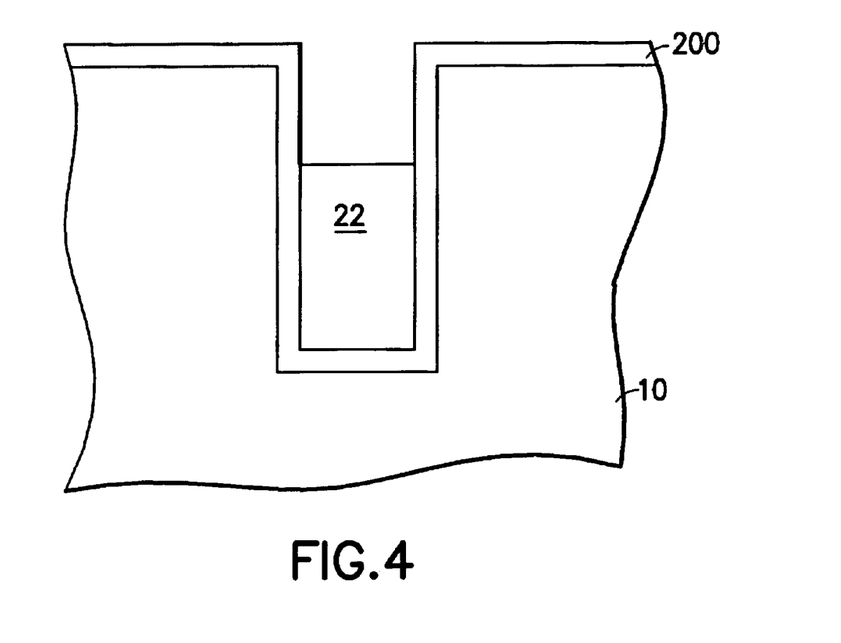

For purposes of the following claims, layer 250 is referred to as the outer layer; layer 240 is referred to as the second layer; layer 230 is referred to as the third layer; layer 220 is referred to as the fourth layer (or the pad nitride layer); and layer 210 is referred to as the fifth layer (or the pad oxide layer). Conventional photoresist fill material 22 is then formed atop oxide layer 250 and within the opening so as to provide the structure shown, for example, in FIG. 3. Resist fill material 22 is a conventional polymeric resist material which is capable of filling an opening. In accordance with the present invention, the resist fill material is formed utilizing a conventional deposition process such as spin-on process. After applying the resist fill material to the structure, the resist fill material shown in FIG. 3 is recessed to a predetermined level (typically about 1 μm or less) beneath the surface of substrate 10 so as to provide the recessed structure shown, for example, in FIG. 4. Recessing is carried out in the present invention by utilizing a conventional timed etching process that is highly selective for removing portions of the resist fill material from the opening, but not oxide layer 250 that is present beneath the resist fill material. Note that portions of oxide layer in the upper portion of the opening are exposed after this recessing step. Following recessing, the exposed portion of oxide layer 250 is removed from the structure selectively, utilizing a conventional wet chemical hydrofluoric-acid(HF)-based etching process, and thereafter the recessed resist fill material is removed from inside the lower portion of the opening utilizing the above-mentioned etching process that was employed in recessing. Alternatively, the resist can be removed utilizing a conventional plasma ashing process. The ashing process can be further optimized to minimize the oxidation of exposed silicon. This optimization can be achieved by adding a forming gas to the ashing gas mixture. These steps of the present invention, i.e., wet etching and removal of the previously recessed resist fill material from the opening, provide the structure shown in FIG. 5. Note that in this drawing, the poly or a-Si layer 240 is exposed in the upper portion of the trench, whereas at least the lower portion of the opening still contains oxide layer 250 thereon.

A timed HF-based clean step may be employed at this step of the present invention to remove any oxide layer that may be present on the exposed upper portions of the openings. This oxide layer can be formed during the resist strip or can be simply a native oxide grown at room temperature by exposing the wafer to the moisture of ambient air. The time of the clean is selected in such a manner that the oxide layer 250 present in the lower portion of the opening loses no more than 2.5 nm of oxide.

In some embodiments of the present invention, an in-situ H2 prebake step may be employed at this step of the present invention to remove any native oxide layer that may be still present on the exposed upper portions of the openings. Specifically, H2 prebaking is performed at a temperature of from about 850° C. to about 1000° C. (950 C. being preferred)and at a reduced pressure of below 300 Torr.

Figure 5:
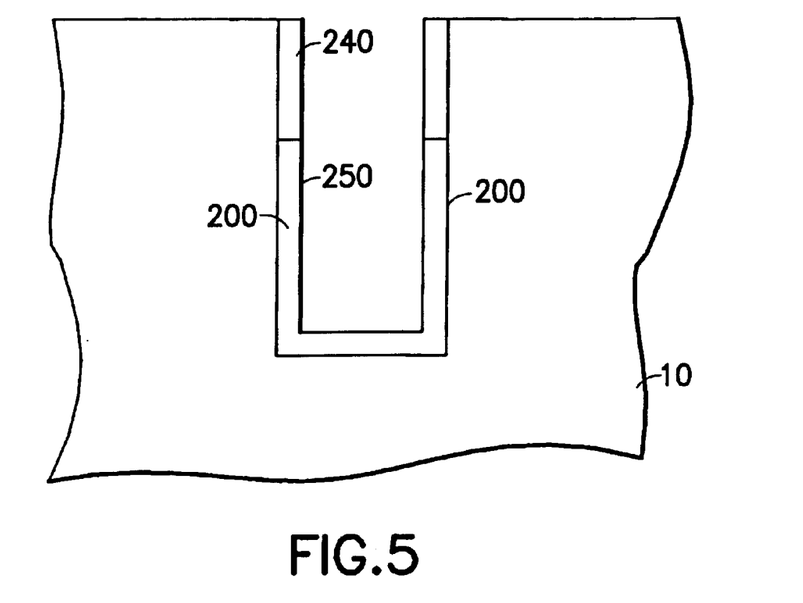
Figure 6:
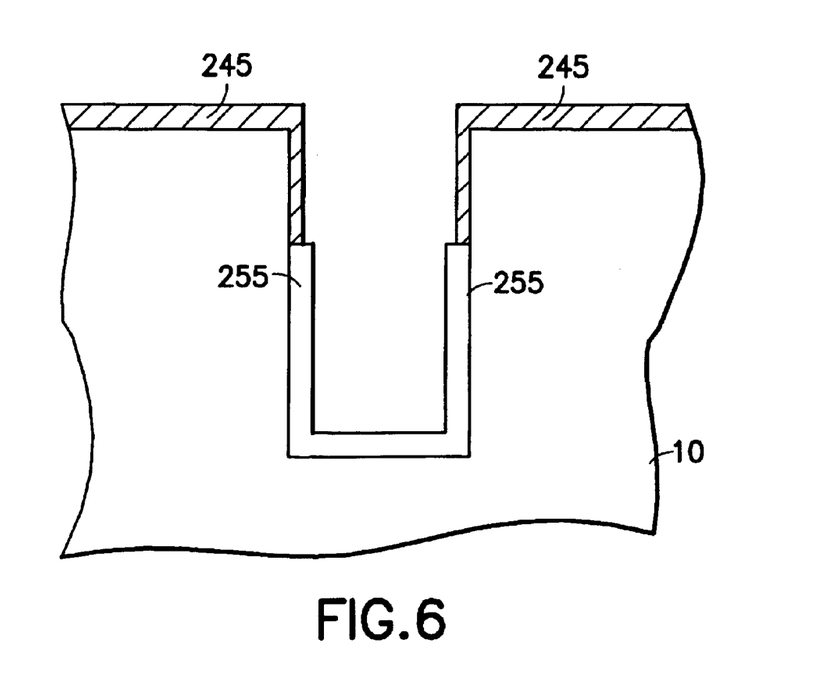

Next, and as shown in FIG. 6, thermal nitride vertical hard mask 245 is formed on at least the upper portion of the sidewalls that are exposed in FIG. 5. The thermal nitride hard mask is a uniform layer whose thickness is from about 10 to about 30 Å. The thermal nitride layer is formed by heating the structure shown in FIG. 5 at high temperatures, on the order of from about 600° C. to about 1200° C., in the presence of a nitrogen-containing source gas. Illustrative examples of nitrogen-containing source gases include, but are not limited to: N2, N2O, NH3 and mixtures thereof. The nitrogen-containing source gas can also include various nitrogen-containing radicals such as atomic nitrogen, NH2, and NH radicals. The radicals can be created with the aid of some excitation, for instance, a plasma excitation, a photo excitation, an electron-beam excitation, or intense heat. The radicals can be primarily formed either in the vicinity of the wafer or far from the processing zone. In the latter case, an efficient delivery system should be present to transfer radicals to the processing zone with minimal losses. If the nitrogen-containing gas consists of an appreciable amount of atomic nitrogen or other nitrogen-containing radicals the thermal nitride can be formed at a substantially lower temperature. The preferred temperature range in this case is from about room temperature to about 1200° C. If the silicon layer 240 hasn't been converted to the polycrystalline phase by the oxidation process for forming layer 250 or by the optional anneal performed after forming layer 250, the high-temperature nitridation step will cause the phase transition. The phase transition may lead to the loss of the stack integrity as alluded above. Therefore, it desirable to convert the layer 240 to a polycrystalline phase prior to the high-temperature nitridation step. As discussed above, such conversion may be achieved by the optional anneal while the layer 240 is constrained. Furthermore, the optional oxide layer 230 may help to keep the stack integrity during the high temperature nitridation. Finally, a low-temperature radical-assisted nitridation is advantageous since the entire process can be conducted at below the amorphous-polycrystalline phase transition temperature. It is noted that during the formation of the thermal nitride layer, oxide layer 250 remaining in the lower portion of the opening is converted into a nitrided oxide layer. The nitrided oxide layer is labeled as 255 in FIG. 6. Advantageously, the nitrided oxide formation is slow compared to the process for nitridation of bare silicon and the total number of silicon-nitrogen bonds in the layer 255 will be much less than that of silicon-nitrogen bonds in the layer 245. The difference can be employed to selectively remove the layer 255 while losing only a small portion of layer 245.

In some prior art processes a sacrificial nitride layer formed by via deposition may be applied to the exposed sidewalls of the opening. The use of thermal nitride instead of deposited nitride is an advantageous feature of the present invention since thermal nitrides are formed preferentially only on the exposed portion of the opening and have a smaller etch rate as compared to deposited nitride. The smaller etch rate allows for selective removal of material from the bottom portion of the opening without completely removing the material from the upper portion of the opening which typically occurs when deposited nitride layers are employed as a vertical hard mask. It is noted that the thermal nitride mask formed at this step is limited in thickness due to the self-limiting nature of thermal nitridation processes. For instance, an exposure of a silicon surface to the ammonia ambient at 1050 C. for 60 seconds produces approximately 2 nm of thermal nitride. Since the thermal nitride growth rate is a strong function of the nitridation temperature, an extremely high process temperature may be required to produce a thermal nitride layer thicker than 2.5 nm. Radical-assisted nitridation processes are promising due to their low-temperature capability but require a set of specialized equipment. The nitride thickening techniques such as selective deposition of silicon nitride onto nitride surfaces but not oxide surfaces is relatively cumbersome and hard to control. Therefore, the thermal nitride vertical hard mask has a practical thickness limit of about 2.5 nm. In some instances, such a thin mask cannot be used in spite of the superior properties of the thermal nitride. It is highly desirable to control the thickness of the nitride vertical hard mask independently of the self-limiting kinetics of nitridation processes. It will be shown below that the inventive stack 200 leads to such vertical hard mask.

Once the thin thermal nitride vertical mask is in place, the film stack on the lower portion is stripped down to the silicon substrate. Illustratively, dotted line 60 in FIG. 2B marks the division between the upper and lower portion of the trench. Layer 255 in the bottom is stripped selective to nitride, using an HF-based solution that etches silicon oxide with a selectivity of better than 20:1 (preferably 40:1) as compared to the etch rate of silicon nitride. During the removal of layer 255 the hard mask layer 245 is slightly etched with an acceptable SiN loss of less than 0.4 nm. A poly strip using a conventional wet chemistry which is highly selective to both silicon oxide and silicon nitride removes layer 240, after which layer 230 is removed using the same technique used for layer 250. It is noted that the thin hard mask 245 was used only as an wet etch mask for blocking silicon etch of layer 240 in the upper portion of the opening. Due to the very high etch selectivity between silicon and thermal silicon nitride, the thickness of the layer 245 can be below 2.5 nm. A conventional hot phosphoric acid strip removes layers 220 and 245.

The nitride strip removes both layer 245 on the top and layer 220 on the bottom, leaving the residual portion of poly 240 on the top and oxide 210 on the bottom.

The top portion of layer 240 is removed using the same technique used for the lower portion. Alternatively, the layer 240 can be fully oxidized by a timed conventional thermal oxidation process. The oxide produced at the top portion of the opening adds to the existing optional oxide layer 230. The pad oxide 210 at the lower portion of the opening thickens during the oxidation process. The time of the process is selected to completely oxidize the polysilicon. It is noted that the thickness of the oxide layer in the top portion of the opening can be made substantially larger than that of the oxide layer in the lower portion of the opening.

In some embodiments, the nitride etch that removes layers 245 and 220 is performed in two steps. First, a short nitride etch is conducted to remove layer 245 and a portion of the layer 220, then the exposed silicon layer 240 is fully oxidized by a conventional thermal oxidation process. It is noted that the presence of nitride layer 220 at the bottom portion of the opening prevents oxidation of the substrate. The remainder of the nitride layer 220 is removed after the oxidation by first deglazing the nitride surface from any residual oxide/oxynitride by a short exposure to an HF-based wet chemistry followed by a conventional SiN wet etch. Such processing allows for a larger difference in thickness of oxide layer 210 in the lower portion of the opening and the layer 230 in the top portion of the opening.

An HF-based timed oxide etch removes layer 210 from the bottom, leaving 1–3 nm of layer 230 on the top. The presence of oxide surface atop of SiN layer 220 increases the etch resistance of that layer compared with the oxide layer 210 on the bottom to allow for fluctuations in thickness and etch rate.

At this stage, the top has the following stack: a layer of oxide 210, nominally 2.8 nm thick, a layer of silicon nitride 220, nominally 5–10 nm thick, and a thin layer of oxide, nominally 2 nm thick and the bottom has the silicon substrate exposed. Therefore, we have formed an oxide/nitride/oxide vertical hard mask where the thickness of silicon nitride layer is controlled by deposition (not self-limiting nitridation kinetics) and can be chosen according to requirements of a particular application. It is noted that the oxide layers are optional and can be easily eliminated. However, the presence of both oxide layers can be advantageous in certain applications.

The vertical nitride hard mask can be used to form elements of an advanced buried 3-D capacitor.

For instance, a layer of hemispherical grained silicon (HSG) is deposited in a conventional process, first a thin (0.5–0.7 nm) layer of oxynitride is created at the bottom portion of the substrate by either baking the hard mask structure d in a nitrogen-containing gas (e.g. in NH3 at 750 C. for 60 sec) or a conventional deposition process such CVD or atomic layer deposition (ALD), then HSG are formed on the nitride surface by a conventional HSG CVD process. An advantageous feature of the invention is that HSG forms poorly on oxide. Thus, the silicon that deposits on the upper portion is a layer of amorphous silicon having a thickness less than 10 nm. It is easily removed later. Therefore, the HISG are selectively formed only at lower portion of the opening. The HSG in the lower portion of the trench are used to increase the surface area of the capacitor. A blanket RIE step using a conventional silicon etching chemistry removes the residual amorphous silicon on the upper portion.

Figure 7:
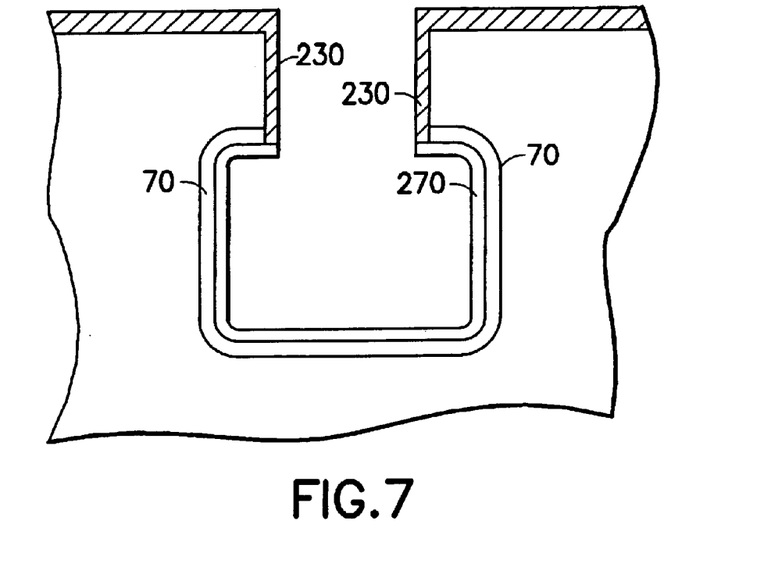

With the nitride vertical hard mask 210-220-230 in place, the structure is subjected to a doping process that forms buried plate 70 about the exposed lower portion of the opening. The resultant structure formed after this step of the present invention is performed is shown, for example, in FIG. 7. numeral 270 denotes the HSG liner. The doping is carried out utilizing a conventional gas phase dopant technique which is well known to those skilled in the art. FIG. 7 also shows an optional structure that is formed after an optional bottle etching process. The bottle etching process can be performed prior to the HSG formation. The bottle etching process includes the use of a well known self-limiting or timed wet etching process wherein a chemical etchant that is selective in removing substrate material as compared to nitride is employed. It is noted that the bottle etching process results in a structure wherein the lower portion of the opening abutting the bottom wall is widened as compared to the upper portion of the opening.

Figure 8:
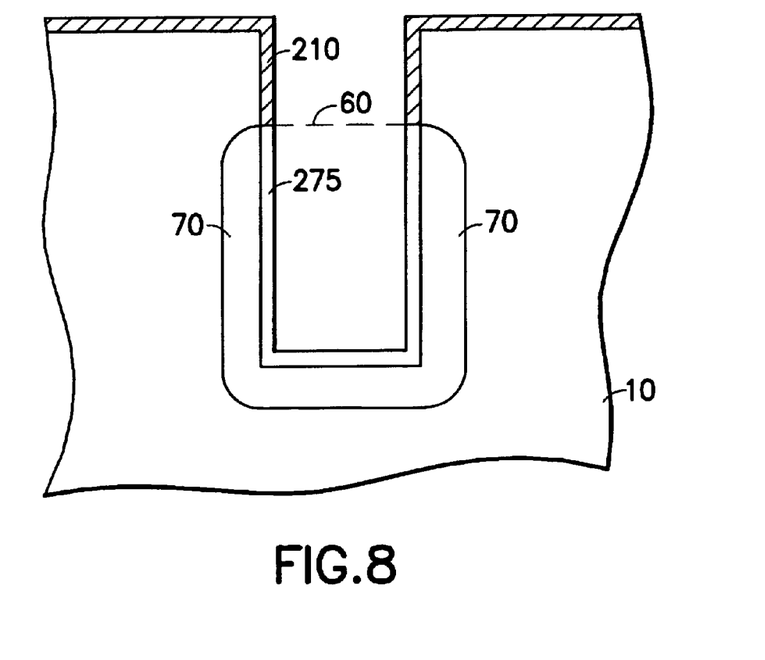
Figure 9:
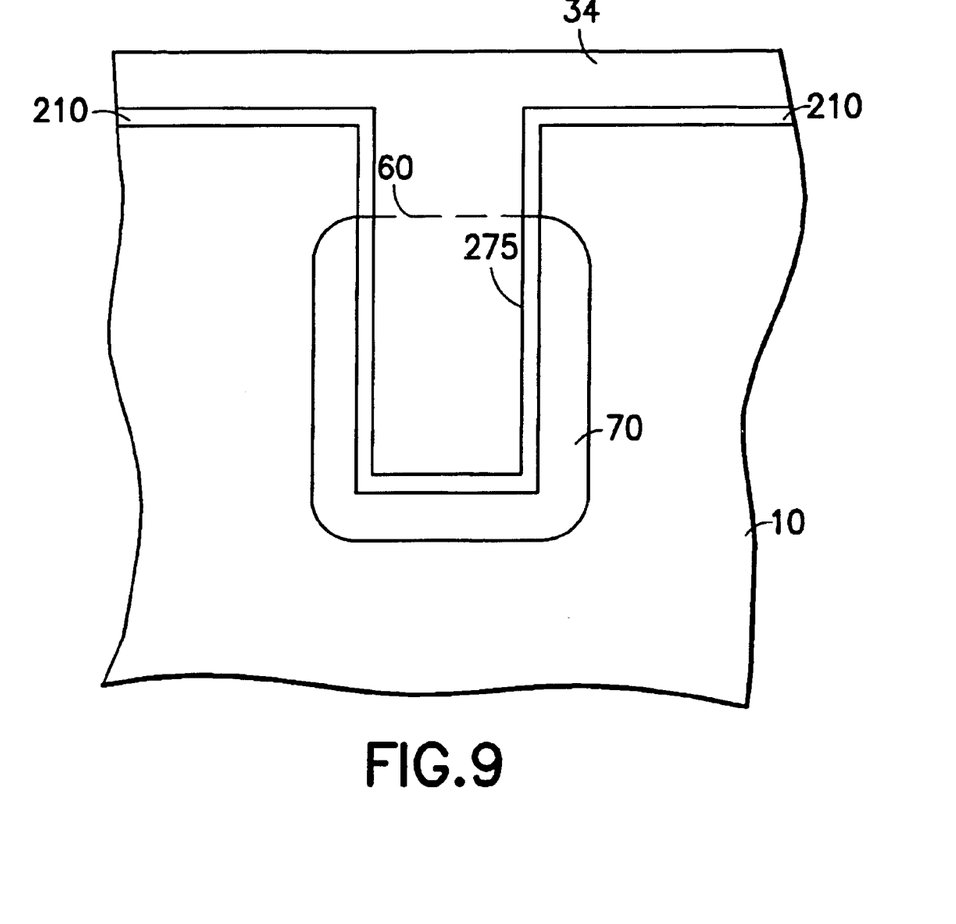

FIG. 8 shows a structure that is formed after the vertical mask is optionally stripped from the upper portion of the opening leaving oxide 210. Layer 275 represents the node dielectric (ill a conventional oxide/nitride layer), together with HSG layer 270. FIG. 9 shows the result of depositing a new liner, ill pad oxide/pad nitride that will be used in conventional steps of forming the conductive connection to the pass transistor of a DRAM cell. Conductive material 34 (ill poly) has been deposited but not yet planarized.

The capacitor formed using the invention may be used in any circuit, ill in a DRAM. Conventional steps will be performed to construct the pass transistor of a DRAM cell or to construct connections from the capacitor to the remainder of an integrated circuit.

Conductive material 34, which is comprised of polysilicon, a conductive metal or any combination thereof is formed utilizing a conventional deposition process such as CVD, plating, or sputtering. Further processing may follow the above described processing steps including, for example, recessing of conductive material 34, buried strap formation, collar formation and formation of a transistor above the capacitor region described above. It is noted that in the preferred embodiment shown above, the vertical hard mask allows for conductive material 34 to be filled into narrow openings, and very simple processing steps compared to a conventional sacrificial oxide collar scheme are employed.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention is not limited to the exact forms and details described and illustrated, but fall within the scope of the appended claims.

Having thus described our invention in detail, what we claim as new and desire to secure by the Letters Patent is:

1. A method of fabricating a microelectronic structure comprising the steps of:
   (a) forming a set of openings in a surface of a substrate, said openings having sidewalls that extend to a common bottom wall;
   (b) forming a film stack comprising a plurality of layers on each sidewall of said openings, said plurality of layers comprising at least a nitride diffusion barrier layer having a barrier thickness, a silicon layer deposited after said barrier layer and an oxide layer deposited after said silicon layer;
   (c) exposing said oxide layer on a lower portion of said structure and said silicon layer on an upper portion of said structure;
   (d) thermally nitriding simultaneously said silicon layer on said upper portion of said structure and said oxide layer on said lower portion of said structure, thereby forming a nitrided silicon layer having a first thickness limited by reaction kinetics and less than said barrier thickness on said silicon layer and a nitrided layer on said oxide layer having a thickness less than said first thickness;
   (e) etching in an oxide etch both said oxide layer in said lower portion and said nitrided silicon layer in said upper portion in an etch selective to nitride such that said oxide layer is removed while a portion of said nitrided silicon layer remains;
   (f) removing said silicon layer in said lower portion while said silicon layer is protected by a remaining portion of said nitrided silicon layer in said upper portion, and
   (g) simultaneously removing said diffusion barrier layer in said lower portion and said remaining portion of said nitrided silicon layer in said upper portion.

2. A method according to claim 1, further comprising the steps of:
   continuing said step (d) of nitriding until said nitrided silicon layer is greater than 1.5 nm in thickness, whereby said nitrided silicon layer remains after steps (e) and (f) of claim 1;
   stripping said layers of said film stack in said lower portion, selective to said nitrided layer of said upper portion until said substrate is exposed in said lower portion; and
   performing a diffusion step in said lower portion while said upper portion is protected by said diffusion barrier.

3. A method according to claim 2, further comprising the steps of:
   doping said substrate through said lower portion of said sidewalls, thereby forming a conductive member about said lower portion of said structure;
   forming a layer of dielectric in said lower portion; and
   filling said structure with a conductive material, whereby said lower portion forms a capacitor.

4. A method according to claim 1, in which said layer of silicon is deposited as amorphous silicon at a temperature below a phase transition temperature from amorphous silicon to poly and is converted to poly before said step of nitriding said poly.

5. A method according to claim 4, further comprising the steps of:
   stripping said layers of said film stack in said lower portion, selective to said nitrided layer of said upper portion until said substrate is exposed in said lower portion; and
   performing a diffusion step in said lower portion while said upper portion is protected by said diffusion barrier.

6. A method according to claim 5, further comprising the steps of:
   doping said substrate through said lower portion of said sidewalls, thereby forming a conductive member about said lower portion of said structure;
   forming a layer of dielectric in said lower portion; and
   filling said structure with a conductive material, whereby said lower portion forms a capacitor.

7. A method according to claim 6, further comprising the steps of:
   exposing said substrate on said lower portion of said structure and a layer of oxide on an upper portion of said structure; and
   depositing a selected material on said structure such that said selected material forms selectively on said substrate, whereby a layer of said selected material is formed preferentially on said substrate and not on said oxide in said upper portion of said sidewall.

8. A method according to claim 7, in which said selected material is hemispherical grained silicon and said substrate is silicon.

9. A method according to claim 1, further comprising a step of forming a second oxide layer after said step of forming said barrier layer and before said step of forming said silicon layer;
   in which said layer of silicon is deposited as amorphous silicon having a thickness greater than 1.5 nm at a temperature below a phase transition temperature from amorphous silicon to poly and is converted to poly before said step of nitriding said poly, whereby said amorphous silicon is converted to poly while being constrained by two layers of oxide.

10. A method according to claim 9, further comprising the steps of:

exposing said substrate on said lower portion of said structure and a layer of oxide on an upper portion of said structure; and depositing a selected material on said structure such that said selected material forms selectively on said substrate, whereby a layer of said selected material is formed preferentially on said substrate and not on said oxide in said upper portion of said sidewall.

11. A method according to claim 10, in which said selected material is hemispherical grained silicon and said substrate is silicon.

12. A method according to claim 9, further comprising the steps of:

stripping said layers of said film stack in said lower portion, selective to said nitrided layer until said substrate is exposed in said lower portion;

stripping said layers of said film stack in said upper portion until a layer of oxide is exposed in said upper portion;

exposing said substrate on said lower portion of said structure and a layer of oxide on an upper portion of said structure; and depositing a selected material on said structure such that said selected material forms selectively on said substrate, whereby a layer of said selected material is formed preferentially on said substrate and not on said oxide in said upper portion of said sidewall.

13. A method according to claim 12, in which said selected material is hemispherical grained silicon, said first material is silicon nitride and said second material is silicon oxide.

14. A method according to claim 12, further comprising the steps of:

doping said substrate through said lower portion of said sidewalls, thereby forming a conductive member about said lower portion of said structure;

forming a layer of dielectric in said lower portion; and filling said structure with a conductive material, whereby said lower portion forms a capacitor.

15. A method according to claim 9, further comprising the steps of:

doping said substrate through said lower portion of said sidewalls, thereby forming a conductive member about said lower portion of said structure;

forming a layer of dielectric in said lower portion; and filling said structure with a conductive material, whereby said lower portion forms a capacitor.

16. A method according to claim 1, in which said silicon layer has a thickness greater than 1.5 nm and said step of nitriding is performed at a temperature less thean conversion temperature from amorphous silicon to poly.

17. A method according to claim 16, in which said step of nitriding is performed with nitrogen-containing radicals generated by excitation means.

18. A method according to claim 17, further comprising the steps of:

doping said substrate through said lower portion of said sidewalls, thereby forming a conductive member about said lower portion of said structure;

forming a layer of dielectric in said lower portion; and filling said structure with a conductive material, whereby said lower portion forms a capacitor.

19. A method according to claim 16, further comprising the steps of:

doping said substrate through said lower portion of said sidewalls, thereby forming a conductive member about said lower portion of said structure;

forming a layer of dielectric in said lower portion; and filling said structure with a conductive material, whereby said lower portion forms a capacitor.

* * * * *